United States Patent
Chyan et al.

(10) Patent No.: US 6,657,281 B1
(45) Date of Patent: Dec. 2, 2003

(54) BIPOLAR TRANSISTOR WITH A LOW K MATERIAL IN EMITTER BASE SPACER REGIONS

(75) Inventors: Yih-Feng Chyan, Orlando, FL (US); Chunchieh Huang, Orlando, FL (US); Chung Wai Leung, Orlando, FL (US); Yi Ma, Orlando, FL (US); Shahriar Moinian, Murray Hill, NJ (US)

(73) Assignee: Agere Systems Inc., Allentown, PA (US)

( * ) Notice: Subject to any disclaimer, the term of this patent is extended or adjusted under 35 U.S.C. 154(b) by 16 days.

(21) Appl. No.: 09/631,755

(22) Filed: Aug. 3, 2000

(51) Int. Cl.$^7$ .............................................. H01L 27/082
(52) U.S. Cl. ...................... 257/591; 257/565
(58) Field of Search ................. 257/565, 574, 257/575, 591, 578–584, 593, 594

(56) References Cited

U.S. PATENT DOCUMENTS

| | | |
|---|---|---|
| 4,908,324 A | 3/1990 | Nihira et al. |
| 5,073,810 A | 12/1991 | Owada et al. |
| 5,204,276 A | 4/1993 | Nakajima et al. |
| 5,294,823 A * | 3/1994 | Eklund et al. ............... 257/370 |
| 5,731,617 A * | 3/1998 | Suda ........................... 257/370 |
| 6,239,477 B1 * | 5/2001 | Johnson ....................... 257/592 |
| 6,414,371 B1 * | 7/2002 | Freeman et al. ............. 257/584 |
| 6,531,369 B1 * | 3/2003 | Ozkan et al. ................ 438/312 |

FOREIGN PATENT DOCUMENTS

JP 62-206880 * 9/1987 ........... H01L/29/72

* cited by examiner

Primary Examiner—Ori Nadav

(57) ABSTRACT

The present invention provides a bipolar transistor located on a semiconductor wafer substrate. The bipolar transistor may comprise a collector located in the semiconductor wafer substrate, a base located in the collector, and an emitter located on the base and in contact with at least a portion of the base, wherein the emitter has a low K layer located therein. The low K layer may be, for example, located proximate a side of the emitter, or it may be located proximate opposing sides of the emitter. In all embodiments, however, the low K layer does not interfere with the proper functioning of the bipolar transistor, and substantially reduces the emitter-base capacitance typically associated with conventional bipolar transistors.

13 Claims, 9 Drawing Sheets

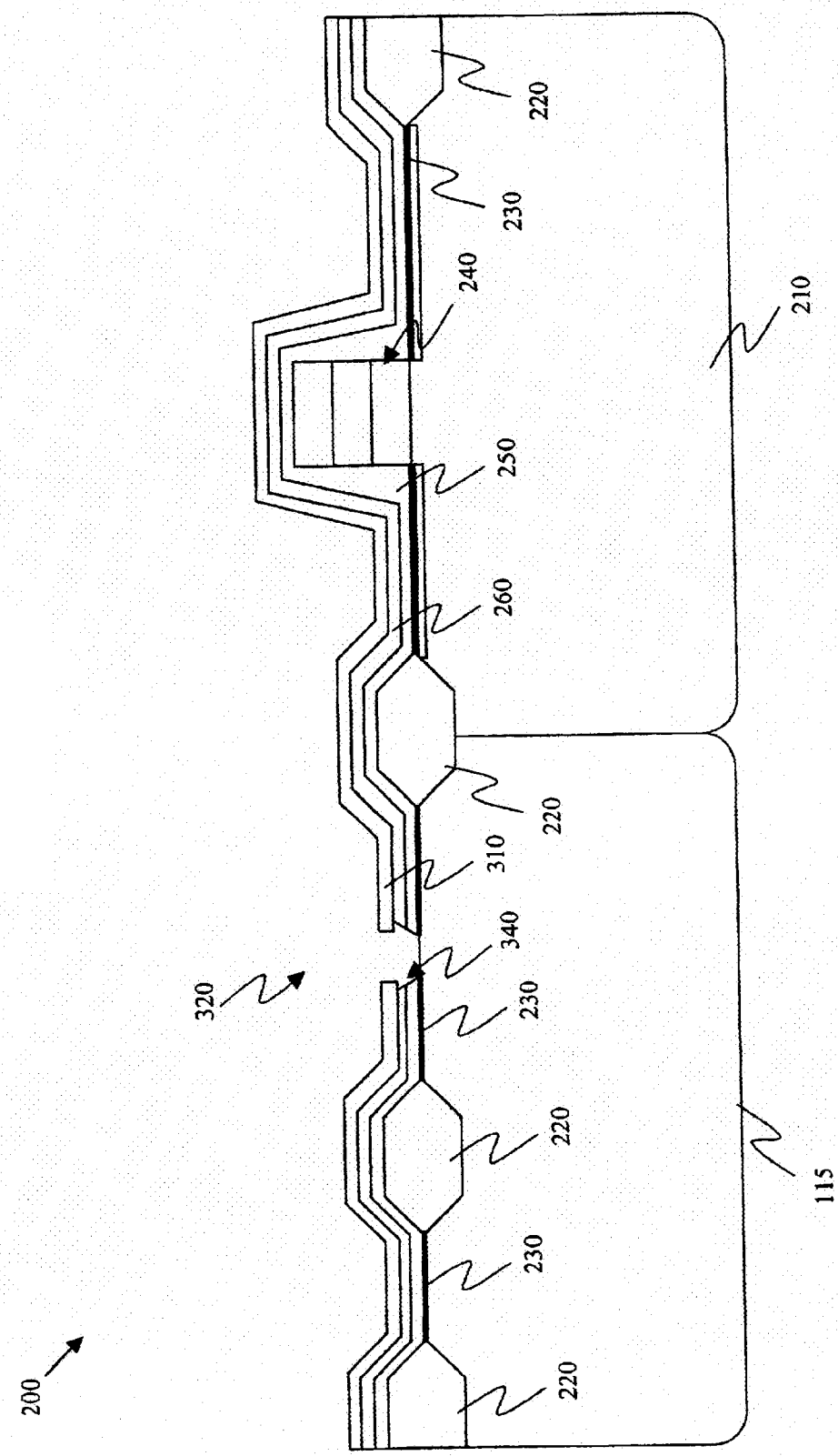

BIPOLAR TRANSISTOR WITH A LOW K MATERIAL IN EMITTER BASE SPACER REGIONS

TECHNICAL FIELD OF THE INVENTION

The present invention is directed, in general, to semiconductor devices with bipolar transistors and associated methods of manufacture and, more specifically, to a bipolar transistor having a low dielectric constant (K) material in the emitter region and a method of manufacture therefore.

BACKGROUND OF THE INVENTION

The advent of the integrated circuit has had a significant impact on various types of communication devices. The integrated circuit has been incorporated into both radio frequency applications and high speed communication network systems. While operation speeds of these communication devices have dramatically increased, the demand for yet faster communication devices continues to rise. Thus, the semiconductor manufacturing industry continually strives to increase the overall speed of the integrated circuit. One way in which the semiconductor industry has increased the speed of the integrated circuit is to continue to shrink the size of the transistor. Over the last few years, the device size of the transistor has gone from 0.5 $\mu$m to 0.32 $\mu$m to 0.25 $\mu$m and now transistor device sizes are heading to the 0.12 $\mu$m range and below. As transistor device sizes have continued to dramatically decrease, with each decrease in size the semiconductor industry has faced new challenges.

One such challenge is elimination of parasitic capacitance. This is particularly important for communication devices and communication network systems in general. One integrated circuit component that is often incorporated into these communication devices and networks, is the bipolar transistor. The bipolar transistor facilitates the faster operating speeds that are needed for complex communication network systems. However, as device sizes have continued to shrink into the sub-micron size, the bipolar transistor has also been a source of decreased operating speed due to the increased parasitic capacitance. For example, in some cases, emitter-base parasitic capacitance ($C_{EBP}$) can be as high as 60% of the total emitter-base capacitance ($C_{EB}$), which severely slows down emitter coupled logic (ECL) type circuits, which are often used in high-speed communication network systems.

The industry has attempted to solve this problem by producing a smaller emitter-base overlap to reduce $C_{EBP}$. However, the production of this device often requires more advanced and expensive photolithographic tools. Moreover, there are increased possibilities of device parameter variations that can cause uniformity and yield issues during production. In addition, non-ideal emitter-base recombination current can severely degrade device performance.

Accordingly, what is needed in the art is a bipolar transistor and a method of manufacture therefore, that avoids the disadvantages associated with the prior art bipolar transistors.

SUMMARY OF THE INVENTION

To address the above-discussed deficiencies of the prior art, the present invention provides a bipolar transistor located on a semiconductor wafer substrate. In one embodiment, the bipolar transistor comprises a collector located in the semiconductor wafer substrate; a base located in the collector; and an emitter located on the base and in contact with at least a portion of the base, wherein the emitter has a low K layer located therein. In one embodiment, the low K layer is located proximate a side of the emitter. More preferably, however, the low K layer is located proximate opposing sides of the emitter. In all embodiments, however, the low K layer does not interfere with the proper functioning of the bipolar transistor. The low K layer, however, does substantially reduce the emitter-base capacitance typically associated with conventional bipolar transistors.

Thus, in one embodiment, the present invention provides a bipolar transistor that reduces emitter-base parasitic capacitance, and thereby, decreases overall capacitance and allows for faster integrated circuit operating speeds. The bipolar transistor provided by the present invention is also easily incorporated into existing complementary metal oxide semiconductor (CMOS) technology without the need for additional equipment, cost or fabrication time.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which:

FIG. 3 illustrates the formation of an opening within the semiconductor device;

DETAILED DESCRIPTION

Figure 1:
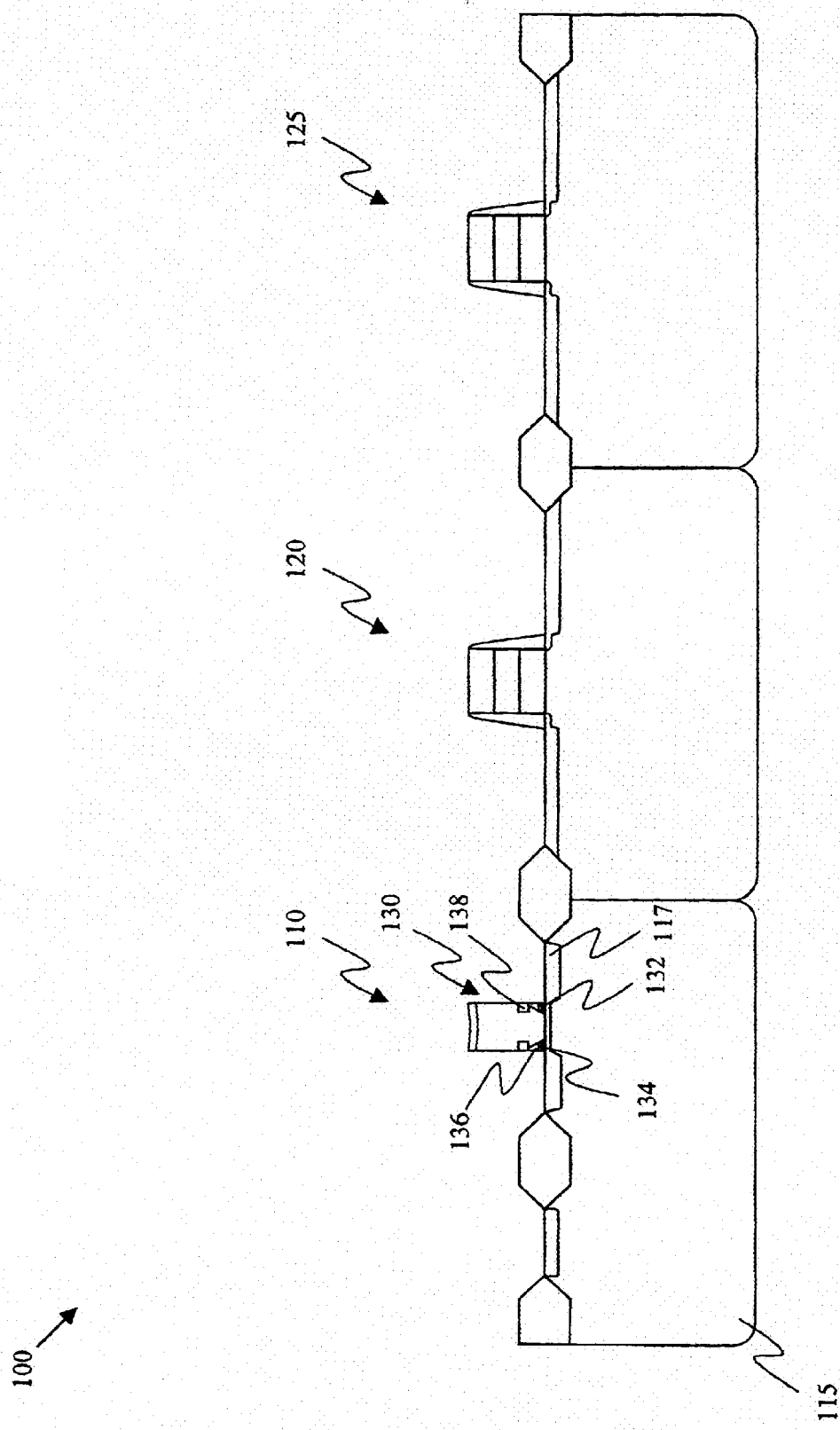
FIG. 1 illustrates a completed semiconductor device, including completed bipolar transistor, of the present invention, and a completed CMOS transistor.

Turning initially to FIG. 1, there is illustrated according to one embodiment of the invention, a partially fabricated semiconductor device 100 on which a completed bipolar transistor structure 110, as covered by the present invention, and conventionally completed complementary metal oxide semiconductor (CMOS) transistors 120, 125, are located. The completed CMOS transistors 120, 125 are preferably located adjacent, and interconnected to, the completed bipolar transistor 110. A plurality of the completed bipolar transistors 110 and a plurality of the completed CMOS transistors 120, 125, may be conventionally interconnected to form an integrated circuit.

The completed bipolar transistor 110 comprises a collector 115, a base 117 and an emitter 130. The emitter 130 includes a low dielectric constant (K) layer 136, an oxide layer 132, and a dielectric layer 138. In a preferred embodiment of the invention, the emitter 130 also includes a higher K layer 134. The low K layer 136 has a lower capacitance than the oxide layer 132, the higher K layer 134 and the dielectric layer 138, and thereby effectively lowers the emitter-base capacitance as well as the emitter-base parasitic capacitance. For example, the higher K layer 134 may comprise a material having a dielectric constant of about 4 or greater, such as silicon dioxide ($SiO_2$), and the low K layer 136 may comprise a dielectric material having a dielectric constant less than about 3.9. Preferably, the dielectric constant of the low K layer 136 ranges from about 3.8 to about 2.1.

This improved capacitance is shown in the following Table I in which the capacitance, associated with different sizes of conventional bipolar transistors made only with silicon dioxide, is compared with the capacitance of bipolar transistors of the same size made in accordance with the principles of the present invention.

TABLE I

| Device Size | $SiO_2$ K ≈ 4.1–3.9 | | Low K K ≈ 3.8–2.1 | |
| --- | --- | --- | --- | --- |
| | $C_{EB}$ | $C_{EBP}$ | $C_{EB}$ | $C_{EBP}$ |
| 0.4 × 1.2 $\mu m^2$ | 4.4fF | 1.76fF | 3.58fF | 0.94fF |
| 0.4 × 0.4 $\mu m^2$ | 1.4fF | 0.84fF | 1fF | 0.44fF |

Emitter-base spacer consists of a 5.0 nm TEOS layer and a 13.5 nm low K material of approximately 2.

In the larger device, as shown in TABLE I, there is about a 20% improvement in the CEB and about a 50% improvement in the $C_{EBP}$ in the device that includes a low K material as compared to the device that does not include the low K material. In the smaller device, there is about a 30% improvement in CEB and about a 50% improvement in the $C_{EBP}$ in the device that includes a low K material as compared to the device that does not include the low K material. In each case, there is a significant improvement in both the $C_{EB}$ and the $C_{EBP}$ capacitance of the device into which the low K material is incorporated. Thus, a lower capacitance of the completed bipolar transistor is realized. The fabrication of the device illustrated in FIG. 1 will now be discussed in more detail.

Figure 2A:
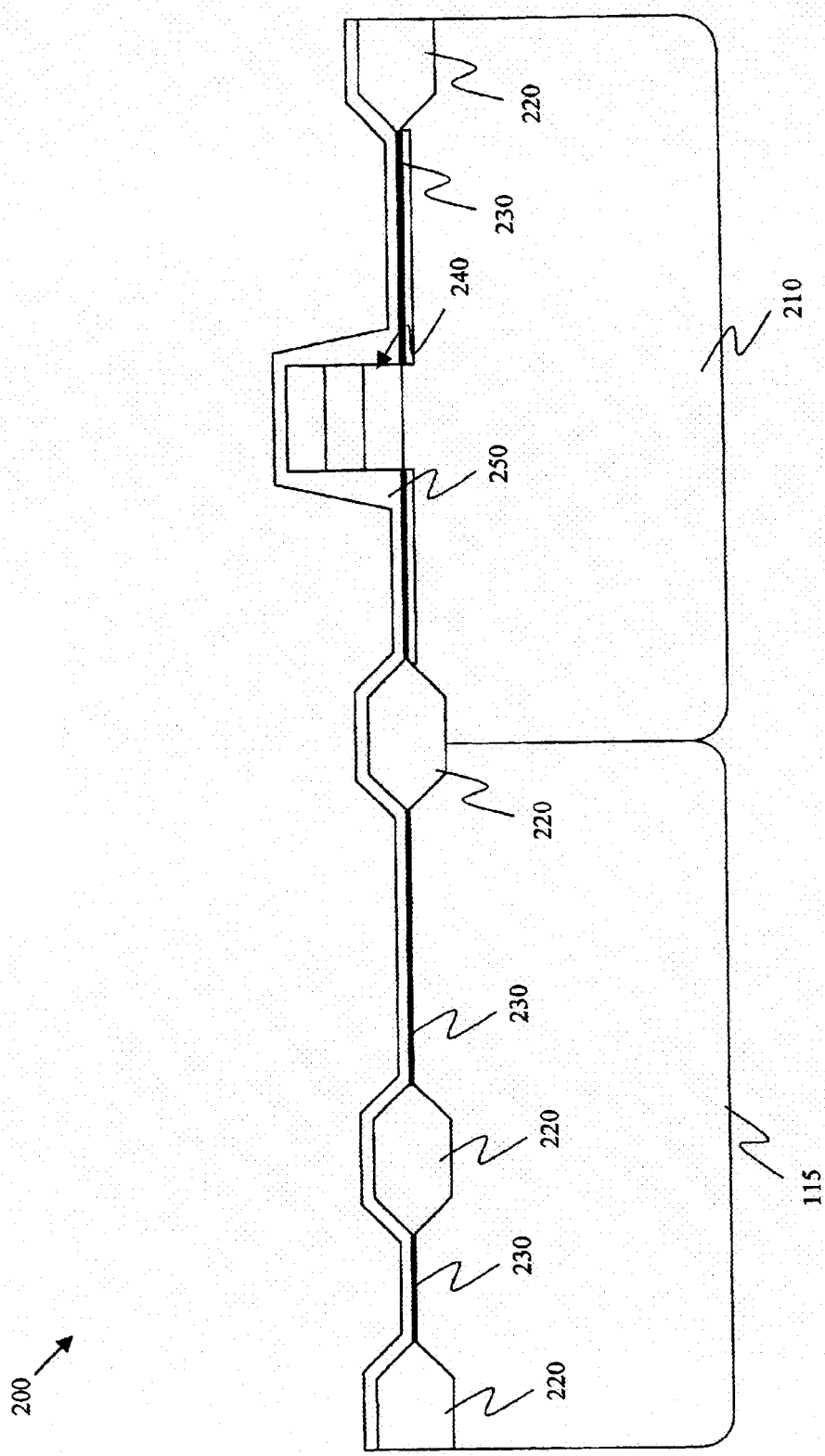
FIG. 2A illustrates a semiconductor device, including a bipolar transistor structure of the present invention, during an initial phase of manufacture.

Turning now to FIG. 2A, there is illustrated the formation of the semiconductor device 100, illustrated in FIG. 1. In this particular illustration, a CMOS transistor tub 210 and the collector tub 115 are conventionally formed on a semiconductor wafer substrate. For illustration purposes, only one CMOS transistor tub 210 has been shown. The illustrated CMOS transistor tub 210 may be doped to provide either a p-type metal oxide semiconductor (PMOS) transistor or an n-type metal oxide semiconductor (NMOS) transistor, depending on the device design. Commonly, the illustrated CMOS transistor tub 210, whether it is for a PMOS or an NMOS device, will have opposing device tubs formed adjacent it, on opposing sides, e.g., a collector tub 115 to one side of the CMOS transistor tub 210 and an opposing CMOS transistor tub to the other side. The transistor tub 210 and the collector tub 115 are preferably formed in a conventional expitaxially-grown layer (details not shown) of the semiconductor device 200. The collector tub 115 may be conventionally doped with an n-type dopant or a p-type dopant.

Also illustrated in FIG. 2A, are field oxides 220, oxide layers 230 and a CMOS gate structure 240, all of which are conventionally formed. The CMOS gate structure 240 is located over the CMOS transistor tub 210. A higher K layer 250, a portion of which ultimately forms the higher K layer 134 of the emitter 130, (FIG. 1), may be conformally deposited over the field oxides 220, oxide layer 230 and CMOS gate structure 240. In one embodiment, the higher K layer 250 may be a silicon dioxide ($SiO_2$) layer formed from the deposition of silane. In another embodiment the silicon dioxide can be formed from tetraethylorthosilicate (TEOS). In yet another embodiment, the higher K layer 250 may comprise both the $SiO_2$ and the TEOS. Thus, in such embodiments the higher K layer 250 comprises first and second higher K layers. Of course, the higher K layer 250 may include more than two layers. In a preferred embodiment the higher K layer 250 is formed to a thickness of about 5 nm, however, one skilled in the art understands that the present invention may use varying thicknesses depending on the design of the device. As mentioned above with respect to FIG. 1, the higher K layer 250 need not be present for the bipolar transistor device 110 (FIG. 1) to operate, but may be used in an alternative embodiment of the invention.

Figure 2B:
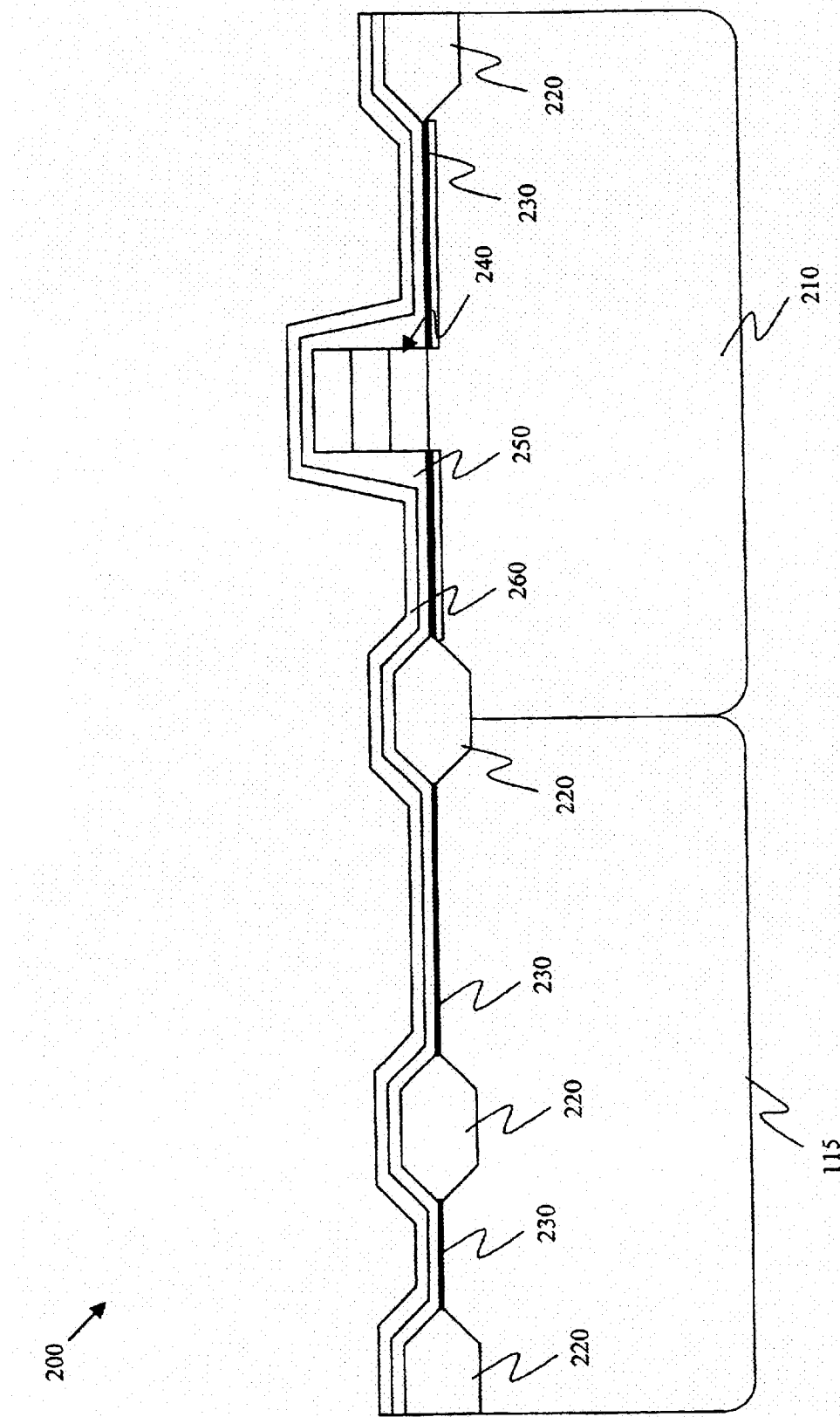
FIG. 2B illustrates the partially constructed semiconductor device FIG. 2A, having an additional layer formed thereon.

Turning now to FIG. 2B, illustrated is the partially constructed semiconductor device 200 of FIG. 2A, having an low K layer 260, a portion of which ultimately forms the low K layer 136 in the emitter 130 (FIG. 1), conformally formed over the higher K layer 250. In a preferred embodiment the low K layer 260 is formed to a thickness of about 135 nm, however, one skilled in the art understands that the present invention may use varying thicknesses depending on the design of the device. The low K layer 260 preferably has a dielectric constant less than the higher K layer 250. For example, the higher K layer 250 may comprise a material having a dielectric constant of about 4 or greater, such as silicon dioxide ($SiO_2$), and the low K layer may comprise a dielectric material having a dielectric constant less than about 3.9. Preferably, the dielectric constant of the low K layer ranges from about 3.8 to about 2.1. Some examples of low k materials include CVD formation of fluorinated oxide (FSG) having a dielectric constant of about 3.6, and spin on formation of hydrogen silsesquioxane (HSQ) having a dielectric constant of about 2.9. Further examples of low K materials include organic polymers like polyarylenes and polyarylene-ethers, which include SiLK (Dow Chemical-Midland, Mich.) and FLARE (AlliedSignal-Morristown, N.J.). Similarly, other low k materials having a dielectric constant of between about 2.6 and 2.8 and often referred to as organosilicate glasses (OSGs), which are carbon-doped silicon dioxide films, include the commercially available Black Diamond (Applied Materials-Santa Clara, Calif.), CORAL (Novellus-Phoenix, Ariz.) and Aurora (ASM-Phoenix, Ariz.), may be used.

Turning now to FIG. 3, after the conformal deposition of the low K layer 260, an dielectric layer 310, such as an amorphous silicon or poly-silicon layer, a portion of which ultimately forms the dielectric layer 138 of the emitter 130 (FIG. 1), is conformally deposited over the low K layer 260. In a preferred embodiment the dielectric layer 310 is formed to a thickness of about 60 nm, however, one skilled in the art understands that the present invention may use varying thicknesses depending on the design of the device. FIG. 3 also illustrates the formation of an opening 320. The partially completed semiconductor device 200 is conventionally patterned with the photoresist to expose a portion where the opening 320 is desired. The exposed portion of the semiconductor device 200 is then subjected to a etch process which forms the illustrated opening 320. As discussed later, the opening 320 must be formed down to the collector 115. It should be noted that, in the illustrated embodiment, the opening 320 has a dished out portion 340. The dished out portion 340 results from the etchant etching the layers 250, 260 faster than the layer 310. In a preferred embodiment of the invention, the etchant is a conventional wet oxide etch. However, one having skill in the art understands that the materials being etched and the etching chemistry being used could vary, in essence altering the above-described etching process.

Figure 4:
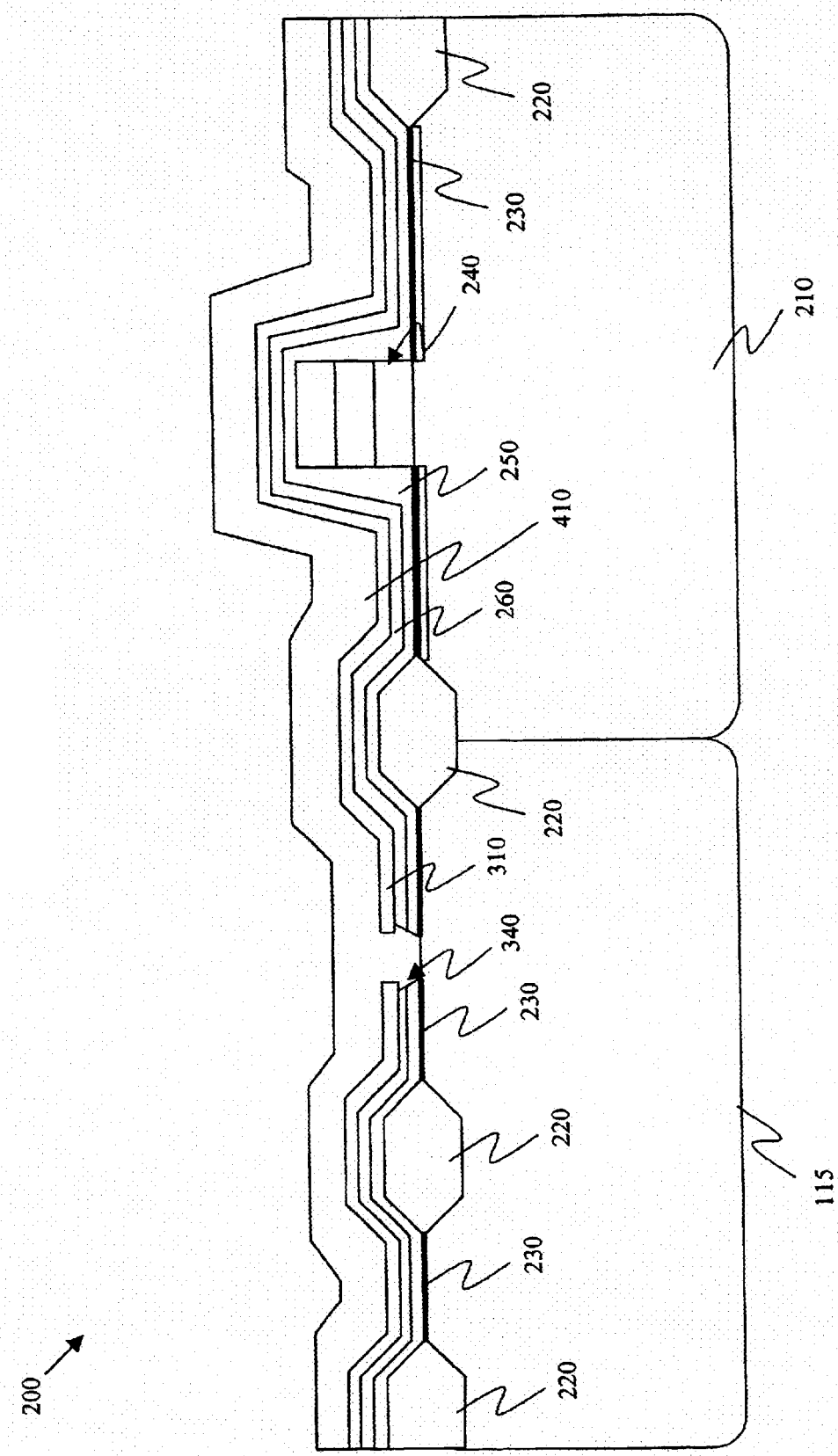
FIG. 4 illustrates the formation of an emitter poly over the partially completed semiconductor device illustrated in FIG. 3.

Referring now to FIG. 4, after formation of the opening 320 a conformal emitter poly layer 410 is conventionally and conformally deposited over the dielectric layer 310, including the dished out portion 340. A portion of the emitter poly layer 410 ultimately forms the emitter 130 of the bipolar transistor 110 (FIG. 1). The emitter poly 410 then undergoes a conventional emitter poly implant.

Figure 5:
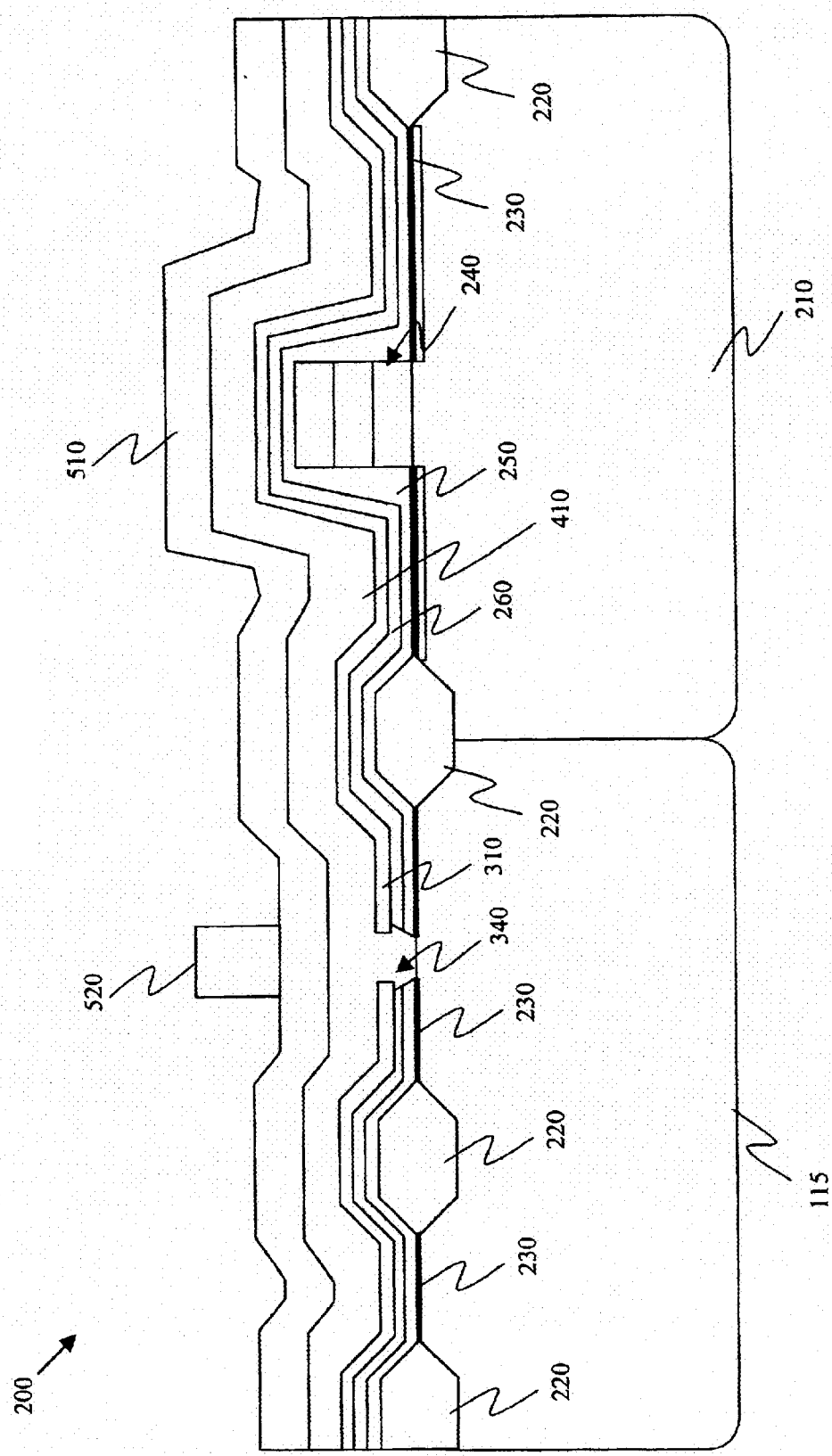
FIG. 5 illustrates the partially completed semiconductor device illustrated in FIG. 4, after a conventional and conformal plasma enhanced tetraethylorthosilicate (PETEOS) layer deposition.

Turning to FIG. 5, illustrated is the partially completed semiconductor device 200 illustrated in FIG. 4, after a conventional conformal deposition of a silicon oxide layer 510 by plasma-enhanced tetraethylorthosilicate (PETEOS). The PETEOS-deposited layer 510 is located over the emitter poly layer 410. Also depicted in FIG. 5, is a photoresist mask 520, over the dished out portion 340, after conventional deposition and development processes of a photoresist layer. The photoresist mask 520 is conventionally formed over a location where the layers 230, 250, 260, 310, 410, 510 are to remain.

Figure 6:
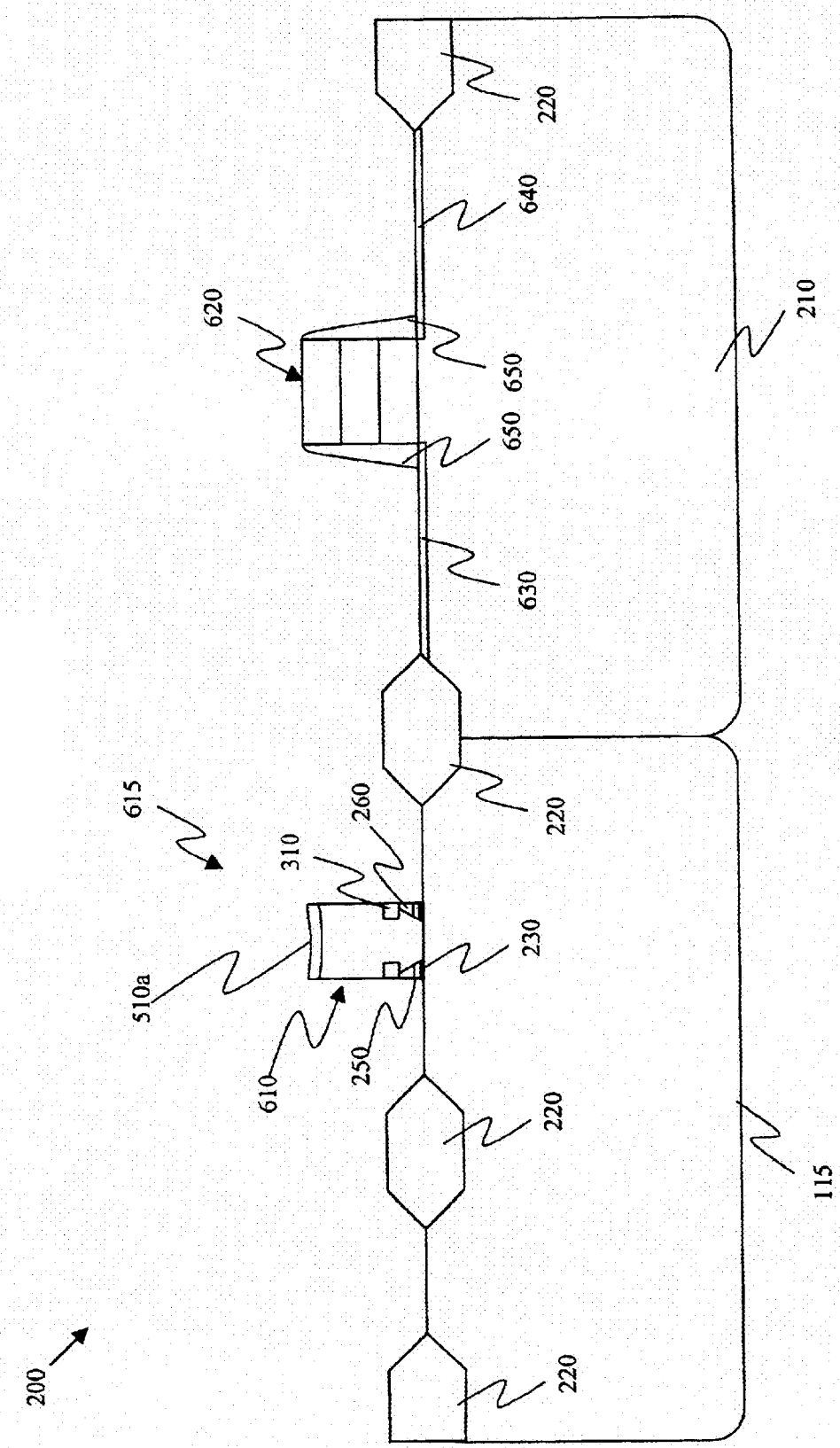
FIG. 6 illustrates a partially completed bipolar transistor and completed gate structure.

Turning now to FIG. 6, after formation of the photoresist mask 520 (FIG. 5), the semiconductor device 200 is subjected to a conventional anisotropic etch, resulting in the emitter 610 of the partially completed bipolar transistor 615 and completed transistor gate structure 620, as illustrated in FIG. 6. As further shown in FIG. 6, the emitter 610 includes remnants of layers 230, 250, 260, and 310. The anisotropic etch has also left a remnant of layer 510, which is shown in FIG. 6 as 510a.

Also illustrated in FIG. 6 are a source region 630 and a drain region 640, after a conventional light dose implanting step, which occurred in previous steps not discussed or shown. Also illustrated are spacers 650 which result from the anisotropic etch. One having skill in the art understands that the light dose dopant used to dope the source region 630 and drain region 640 is opposite the dopant used to form the CMOS transistor tub 210. Thus, as mentioned earlier, if the CMOS transistor tub 210 were a PMOS transistor tub and doped with an n-type dopant concentration, the source region 630 and drain region 640 would be lightly doped with a p-type dopant. Furthermore, the converse also holds true if the CMOS transistor tub 210 were an NMOS transistor tub.

Figure 7:
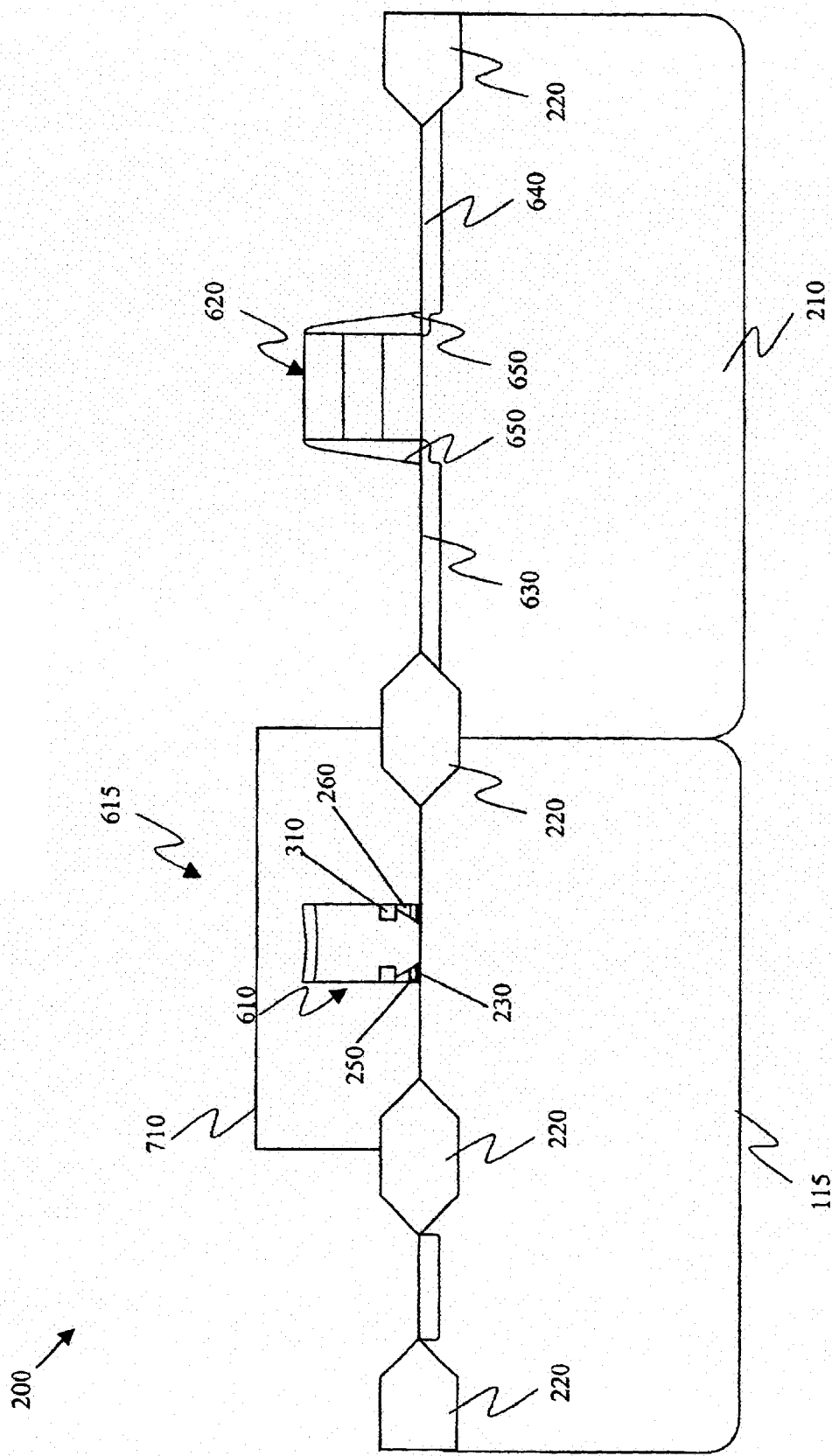
FIG. 7 illustrates the deepening of the source region and the drain region.

FIG. 7 illustrates the source region 630 and the drain region 640 after they are doped further by a source/drain implant. As illustrated, the region over the emitter 610 is covered with photoresist 710 and patterned, such that all regions, excluding the region over the emitter 610, are exposed to a high dose implant. As illustrated, the high dose implant deepens the portions of the source and drain regions 630, 640 that are not covered by the spacers 650. One skilled in the art understands that, as illustrated in FIG. 1, located adjacent the CMOS transistor tub 210 may be another CMOS transistor tub. Similarly, one skilled in the art understands that the adjacent CMOS transistor tub (FIG. 1) could be covered by the photoresist 710 as well.

Figure 8:
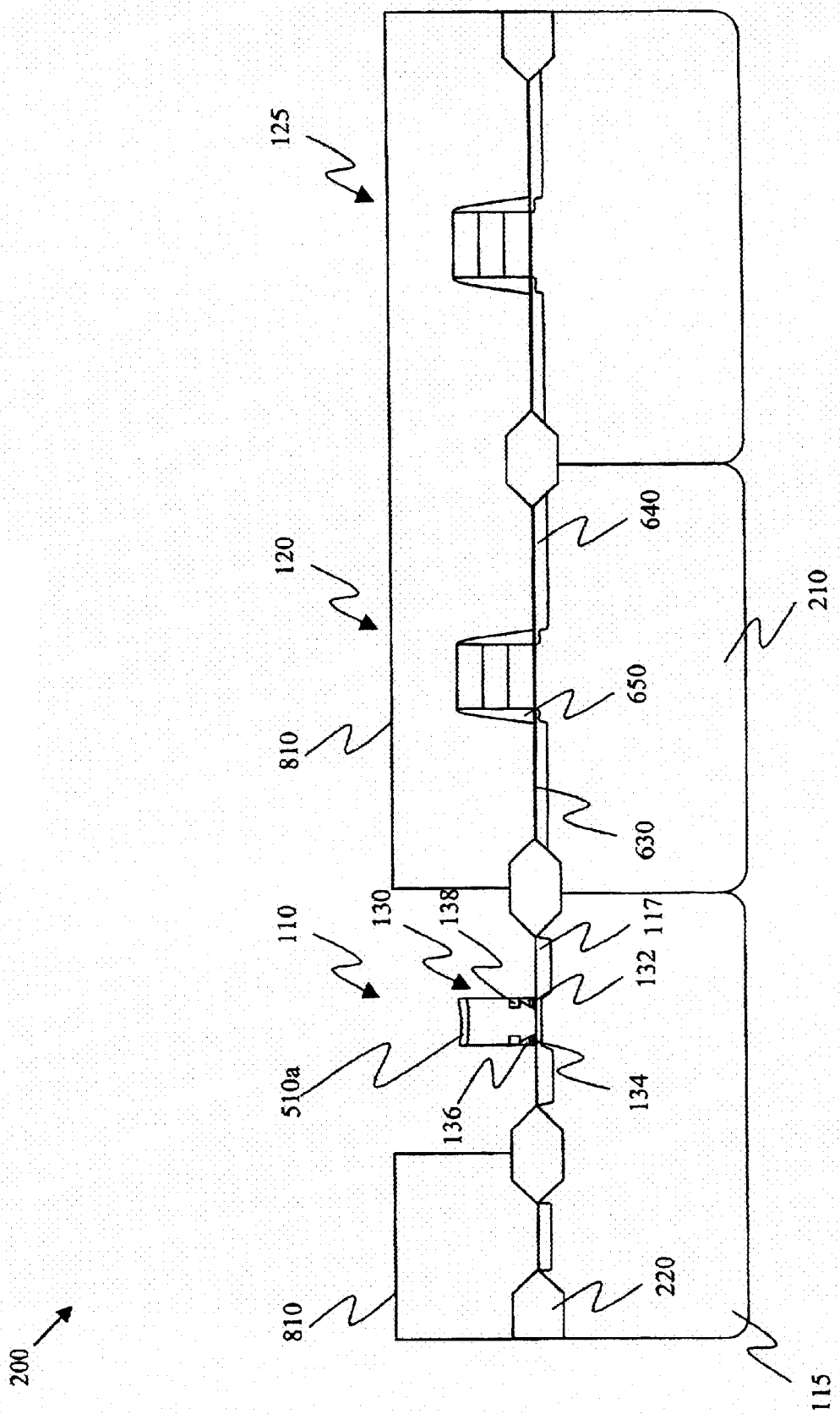
FIG. 8 illustrates the formation of a base that is located in the collector.

Turning to FIG. 8 with continued reference to FIG. 1, after the high dose implant, the photoresist 710 (FIG. 7) is removed and a new photoresist 810 is conventionally deposited, and patterned to expose only the portion that was covered in the previous step. The collector 115 is then exposed to an implanting step, which forms the base 117 that is located in the collector 115 and completes the formation of the bipolar transistor 110. The emitter 130 is thus located on and is in contact with at least a portion of the base 117. In the illustrated embodiment, the outer regions of the emitter 130 form capacitance due to the presence of the dielectric materials 132, 134, 136, and 138 separating portions of the conductive emitter 130 from portions of the conductive base 117. As mentioned with respect to all the doping steps, the dopant may vary in type between a p-type and an n-type; however, the dopant should be opposite that used to dope the collector 115. The photoresist 810 is then removed leaving the completed bipolar transistor 110 and the CMOS transistors 120, 125, as shown in FIG. 1. One skilled in the art understands that the CMOS transistor 120 could be formed in a complementary fashion with respect to the adjacent CMOS transistor 125, wherein the bipolar transistor 110 is formed thereafter (as shown in FIGS. 2–8), or in an alternative embodiment, the illustrated CMOS transistor 120 is formed in a complementary fashion with respect to both the bipolar transistor 110 and the adjacent CMOS transistor 125, since the bipolar transistor 110 and the adjacent CMOS transistor 125 typically use similar dopants.

Although the present invention has been described in detail, those skilled in the art should understand that they can make various changes, substitutions and alterations herein without departing from the spirit and scope of the invention in its broadest form.

What is claimed is:

1. A bipolar transistor located on a semiconductor wafer substrate, comprising:
   a collector located in the semiconductor wafer substrate;
   a base located in the collector; and
   an emitter located directly on an upper surface of the base and in contact with at least a portion of the base, the emitter having a low dielectric constant layer located therein, wherein the entire low dielectric constant layer is located within a footprint created by the emitter, and wherein the emitter is in contact with a first surface of the low dielectric constant layer and is in contact with a second opposing surface of the low dielectric constant layer.

2. The bipolar transistor as recited in claim 1 further including a complementary metal oxide semiconductor (CMOS) transistor device located adjacent to the bipolar transistor, the bipolar transistor and the CMOS transistor device interconnected to form an integrated circuit.

3. The bipolar transistor as recited in claim 1 wherein the low dielectric constant layer is located proximate opposing sides of the emitter.

4. The bipolar transistor as recited in claim 1 further comprising a higher dielectric constant layer located within the emitter and between the low dielectric constant layer and the base.

5. The bipolar transistor as recited in claim 4 wherein the higher dielectric constant layer comprises first and second higher dielectric constant layers.

6. The bipolar transistor as recited in claim 4 further comprising an amorphous silicon layer located over the low dielectric constant layer.

7. The bipolar transistor as recited in claim 4 wherein the higher dielectric constant layer comprises silicon dioxide and the low dielectric constant layer includes a material having a dielectric constant less than a dielectric constant of the silicon dioxide.

8. The bipolar transistor as recited in claim 4 wherein the higher dielectric constant layer includes a material having a dielectric constant of about 4 or greater.

9. The bipolar transistor as recited in claim 1 wherein the low dielectric constant layer has a dielectric constant ranging from about 3.8 to about 2.1.

10. The bipolar transistor as recited in claim 1 wherein the low dielectric constant layer provides the bipolar transistor with an emitter-base capacitance that ranges from about 20% to about 30% less than a bipolar transistor lacking the low dielectric constant layer, and an emitter-base parasitic capacitance that is about 50% less than a bipolar transistor lacking the low dielectric constant layer.

11. The bipolar transistor as recited in claim 1 wherein the bipolar transistor is located adjacent a p-type metal oxide semiconductor (PMOS) transistor.

12. The bipolar transistor as recited in claim 1 wherein the bipolar transistor is located adjacent an n-type metal oxide semiconductor (NMOS) transistor.

13. A bipolar transistor located on a semiconductor wafer substrate, comprising:

a collector located in the semiconductor wafer substrate;

a base located in the collector; and an emitter located directly on an upper surface of the base and in contact with at least a portion of the base, the emitter having a low dielectric constant layer located therein, wherein the emitter is in contact with both an upper surface of the low dielectric constant layer and a lower surface of the low dielectric constant layer.

* * * * *